(12) United States Patent
Ahn

(10) Patent No.: US 6,633,074 B2
(45) Date of Patent: *Oct. 14, 2003

(54) INTEGRATED CIRCUIT WIRING WITH LOW RC TIME DELAY

(75) Inventor: Kie Y. Ahn, Chappaqua, NY (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,329

(22) Filed: Jun. 3, 1999

(65) Prior Publication Data

US 2001/0015494 A1 Aug. 23, 2001

Related U.S. Application Data

(62) Division of application No. 08/874,389, filed on Jun. 13, 1997.

(51) Int. Cl.[7] ............................................. H01L 29/00
(52) U.S. Cl. ..................... 257/522; 257/758; 257/762
(58) Field of Search .......................... 257/522, 762, 257/765, 751, 763, 758; 438/619, 622, 637, 421, 422

(56) References Cited

U.S. PATENT DOCUMENTS

| 5,000,818 A | 3/1991 | Thomas et al. ............. 437/203 |
| 5,034,799 A | * 7/1991 | Tomita et al. .............. 257/758 |
| 5,071,518 A | 12/1991 | Pan ............................ 205/122 |

(List continued on next page.)

FOREIGN PATENT DOCUMENTS

| EP | 0 393 635 A2 | 10/1990 |
| EP | 0 475 646 A2 | 3/1992 |

OTHER PUBLICATIONS

Carley, L., et al., "Fabrication and Performance of Mesa Interconnect," Proceedings of the 1996 International Symposium on Low Power Electronics and Design, Aug. 1996, pp. 133–137.

Togo, M. et al., "A Gate–side Air–gap Structure (GAS) to Reduce the Parasitic Capacitance in MOSFETs," 1996 Symposium on VLSI Technology Digest of Technical Papers, pp. 38–39.

Anand, M. et al., "NURA: A Feasible, Gas–Dielectric Interconnect Process," 1996 Symposium on VLSI Technology Digest of Technical Papers, pp. 82–83.

Parameswaran, M. et al., "A New Approach for the Fabrication of Micromechanical Structures." Sensors and Activators, vol. 19, pp. 289–307 (1989).

*Primary Examiner*—Phat X. Cao
(74) *Attorney, Agent, or Firm*—Kirkpatrick & Lockhart LLP

(57) ABSTRACT

The present invention is directed to a semiconductor interconnect structure comprised of a promoter layer defining openings and a metal layer having a portion elevated above the substrate assembly and a portion that fills the openings. The metal layer is in electrical contact with the substrate assembly through the portion of the metal layer that fills the openings. The portion of the metal layer that fills the openings supports the elevated portion of the metal layer. A method of fabricating a semiconductor interconnect structure is also provided. A resist layer is patterned on a substrate assembly to define openings. A metal layer is deposited on the resist layer and into the openings, and the resist layer is removed to form a gap between the metal layer and the underlying substrate assembly.

16 Claims, 7 Drawing Sheets

U.S. PATENT DOCUMENTS

| | | | |
|---|---|---|---|
| 5,272,111 A | 12/1993 | Kosaki | 437/192 |
| 5,354,712 A * | 10/1994 | Ho et al. | 438/643 |
| 5,391,921 A | 2/1995 | Kudoh et al. | 257/758 |
| 5,521,121 A * | 5/1996 | Tsai et al. | 438/627 |
| 5,556,812 A | 9/1996 | Leuschner et al. | 437/209 |
| 5,639,686 A | 6/1997 | Hirano et al. | 437/189 |
| 5,686,760 A * | 11/1997 | Miyakawa | 257/751 |
| 5,783,864 A * | 7/1998 | Dawson et al. | 257/758 |
| 5,798,559 A * | 8/1998 | Bothra et al. | 257/758 |
| 5,824,599 A * | 10/1998 | Schacham-Diamand et al. | 438/678 |
| 5,834,845 A * | 11/1998 | Stolmeijer | 257/752 |
| 5,843,837 A * | 12/1998 | Baek et al. | 438/627 |
| 5,950,102 A * | 9/1999 | Lee | 257/758 |
| 5,953,626 A * | 9/1999 | Hause et al. | 438/622 |
| 6,069,068 A * | 5/2000 | Rathore et al. | 438/628 |

* cited by examiner

US 6,633,074 B2

INTEGRATED CIRCUIT WIRING WITH LOW RC TIME DELAY

CROSS REFERENCE TO RELATED APPLICATIONS

This is a divisional of copending U.S. patent application Ser. No. 08/874,389, filed Jun. 13, 1997.

STATEMENT REGARDING FEDERALLY SPONSORED RESEARCH OR DEVELOPMENT (Not Applicable)

BACKGROUND OF THE INVENTION

1. Field of the Invention

The present invention is directed generally to semiconductor interconnect layers exhibiting a low RC time delay, and, more particularly, to semiconductor interconnect layers made of a material having a low resistivity that is surrounded by a material with a low dielectric constant.

2. Description of the Background

It is common in the semiconductor art to use layers of metal, polysilicon, or another conductor to conduct current between various semiconductor devices that form integrated circuits. The layers of conductor are connected to each other by means of vias and are connected to other materials by means of contacts.

When a metal is used to form the interconnect layers of conductors, the metal is usually deposited on the semiconductor by sputtering, chemical vapor deposition (CVD), or evaporation. The CVD process forms a non-volatile solid film on a substrate by the reaction of vapor phase chemicals that contain the desired constituents. The metals that are commonly used for the interconnect layers are aluminum and its alloys. The metal layers are typically deposited over dielectric materials, such as silicon dioxide. Thus, parallel plate capacitive effects are observed due to this structure. The capacitance for a layer can be represented as:

$$C = \frac{\epsilon_0 \epsilon_{ins} A}{D} \quad (1)$$

where:

D=SiO$_2$ thickness
A=Area of plates
$\epsilon_0$=Permittivity of free space
$\epsilon_{ins}$=Permittivity of SiO$_2$ This capacitance increases as the density of the integrated circuits increases. Also, the line resistance due to the metal layers increases as the density of the integrated circuits increases. The resistance of a sheet of conducting material is given as:

$$R_s = \frac{pl}{tW} \quad (2)$$

where:

p=Material resistivity
t=Material thickness
L=Material length
W=Material width

Thus, the time delay caused by the product of the line resistance and the capacitance becomes critical.

FIG. 1 shows a cross sectional view of a typical semiconductor device (a transistor) in simplified form. A Local Oxidation of Silicon (LOCOS) process is performed on a substrate layer 10 to create a gate oxide region 12 separated by field oxide regions 13. A polysilicon layer 14 is then deposited, typically to form the gate structure of the transistor, and a spacer 15 is fabricated around the remainder of layer 14. Impurities are diffused into the substrate layer 10 to form diffusion areas 16, which typically form the drain and source structures of the transistor. A layer of silicon dioxide 18 is grown and the contact and via areas are removed by etching. A silicide or metal layer 20 is formed on the diffusion areas 16, which typically provide areas for interconnection with the drain and source structures of the transistor. A first layer of metal 22, typically aluminum or an alloy of aluminum, is then deposited and areas are removed to form the required interconnection pattern. Alternatively, metal contact plugs may be formed in the contact and via area formed in layer 18. Subsequent layers of silicon dioxide and metal may be grown and deposited, respectively, depending on the interconnection pattern required for the integrated circuit.

An attempt to reduce the capacitance associated with interconnect layers deposited on dielectric materials is shown in Togo, et al., "A Gate-side Air-gap Structure (GAS) to Reduce the Parasitic Capacitance in MOSFETs", 1996 Symposium on VLSI Technology Digest of Technical Papers, pp 38–39. Togo, et al. outlines a transistor structure in which the sidewalls of the gate structure are surrounded by an air gap. A silicon nitride sidewall is first fabricated that surrounds the gate. A layer of silicon dioxide is formed around the silicon nitride sidewall. The silicon nitride sidewall is removed by a wet etching process to form an air gap between the gate structure and the silicon dioxide.

Another attempt to reduce the capacitance associated with interconnect layers deposited on silicon is shown in Anand, et al., "NURA: A Feasible, Gas-Dielectric Interconnect Process", 1996 Symposium on VLSI Technology Digest of Technical Papers, pp. 82–83. Anand, et al. outlines a metal interconnect structure in which layers of a gas are formed between thin layers of silicon dioxide. The thin layers of silicon dioxide have metal interconnect layers deposited on them. The process begins when layers of carbon are formed on a surface and trenches are formed for future interconnections. An interconnect metal layer is formed in the carbon trenches and a thin layer of silicon dioxide is sputter-deposited. Oxygen is then furnace ashed into the carbon layer through diffusion and the oxygen reacts with the carbon to form carbon dioxide. This process is repeated to form the interconnect structure of the device under fabrication.

Although Togo, et al. claims to reduce the capacitance associated with the interconnect layers by reducing the dielectric constant of the materials between the interconnect layers, Togo, et al. only provides a low dielectric material (air) around the gate contact of a transistor. Also, Togo, et al. does not disclose an interconnect structure that has reduced resistivity.

Likewise, even though Anand, et al. claims to reduce the capacitance associated with the interconnect layers by reducing the dielectric constant of the materials between the interconnect layers, Anand, et al. adds complexity to the semiconductor fabrication process because carbon is used in the process, which is not typically used in the manufacture of semiconductor devices. The method of Anand, et al. does not disclose an interconnect structure that has reduced resistivity.

Thus, the need exists for a semiconductor interconnect structure with reduced capacitance and reduced resistivity, thereby decreasing the RC time delay associated with the interconnect layers. The need also exists for a method of fabricating such a structure using standard fabrication steps in conjunction with commercially available processing equipment.

SUMMARY OF THE INVENTION

The present invention is directed generally to a semiconductor interconnect structure and a method of making the same. Layers of photoresist are formed between conductive layers and the photoresist is removed by, for example, ashing in oxygen plasma. When the photoresist layers are removed, the conductive layers are surrounded by air, which has a dielectric constant of 1. The conductive layers are preferably comprised of copper.

The present invention represents significant advantages over the prior art. Because the air spaces between the conductive interconnect layers are formed by removing layers of photoresist, no extra material need be introduced into the semiconductor manufacturing process. Also, because the conductive interconnect layers are surrounded by air, the plate capacitance of the interconnect structure is reduced. Furthermore, because a low resistive material such as copper is used for the conductive interconnect layers, the resistance associated with the interconnect structure is reduced. Using copper as the material for the interconnect layers has the further advantage that the layers may be electroplated or electroless plated at low temperatures. Those advantages and benefits of the present invention, and others, will become apparent from the Detailed Description of the Invention hereinbelow.

BRIEF DESCRIPTION OF THE DRAWINGS

For the present invention to be clearly understood and readily practiced, the present invention will be described in conjunction with the following figures wherein.

DETAILED DESCRIPTION OF THE INVENTION

It is to be understood that the figures have been simplified to illustrate only those aspects of semiconductor topography which are relevant, and some of the dimensions have been exaggerated to convey a clear understanding of the present invention, while eliminating, for the purposes of clarity, some elements normally found on a semiconductor. Those of ordinary skill in the art will recognize that other elements and process steps are required to produce an operational semiconductor. However, because such elements and process steps are well known in the art, and because they do not further aid in the understanding of the present invention, a discussion of such elements is not provided herein.

Figure 1:
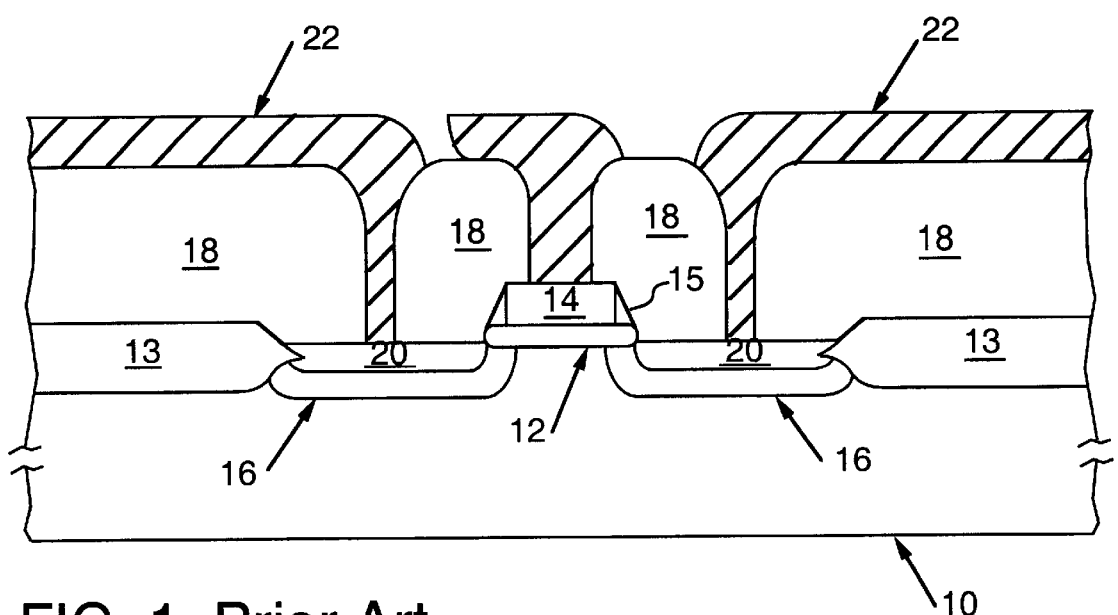
FIG. 1 is a cross-sectional view of a typical prior art semiconductor device.
Figure 2:
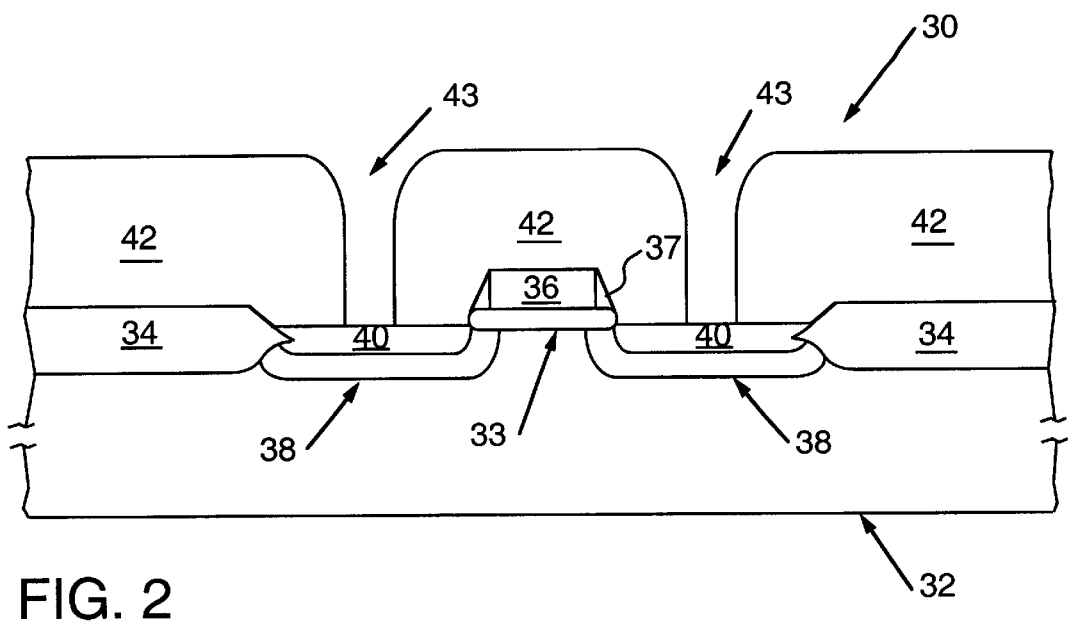
FIG. 2 is a cross-sectional view of a substrate assembly on which a layer of photoresist has been deposited, masked, hardened, and etched.

FIG. 2 shows a cross-section of a substrate assembly 30 at an early stage in the fabrication process of the present invention. The substrate assembly 30 includes a substrate layer 32, which is the lowest layer of semiconductor material on a wafer, and additional layers or structures formed thereon. A LOCOS process is performed to provide a layer of gate oxide 33 separated by field oxide regions 34. A polysilicon layer 36 is deposited and etched to provide a contact area, typically for the gate terminal of a transistor. A spacer 37 may be formed along the layer 36 using conventional techniques. Impurities are diffused into the substrate 34 through suitable masks to form diffusion areas 38. The diffusion areas 38 give rise to depletion regions that essentially isolate the source and drain terminals of the transistor from one another by two diodes. Silicide layers 40 are formed on the diffusion areas 38. The silicide layers 40 are formed by depositing a refractory metal such as titanium, platinum, palladium, cobalt, or tungsten on polysilicon. The metal/silicon alloy is then sintered to form the silicide layers 40.

After the silicide layers 40 are formed, the substrate assembly 30 is then ready for metallization. A layer of photoresist 42 is deposited on the substrate assembly 30 and is masked, hardened, and etched to define openings 43 for contact plugs. The photoresist layer 42 is hardened by baking the substrate assembly 30 at a temperature typically below 100° C.

Figure 3:
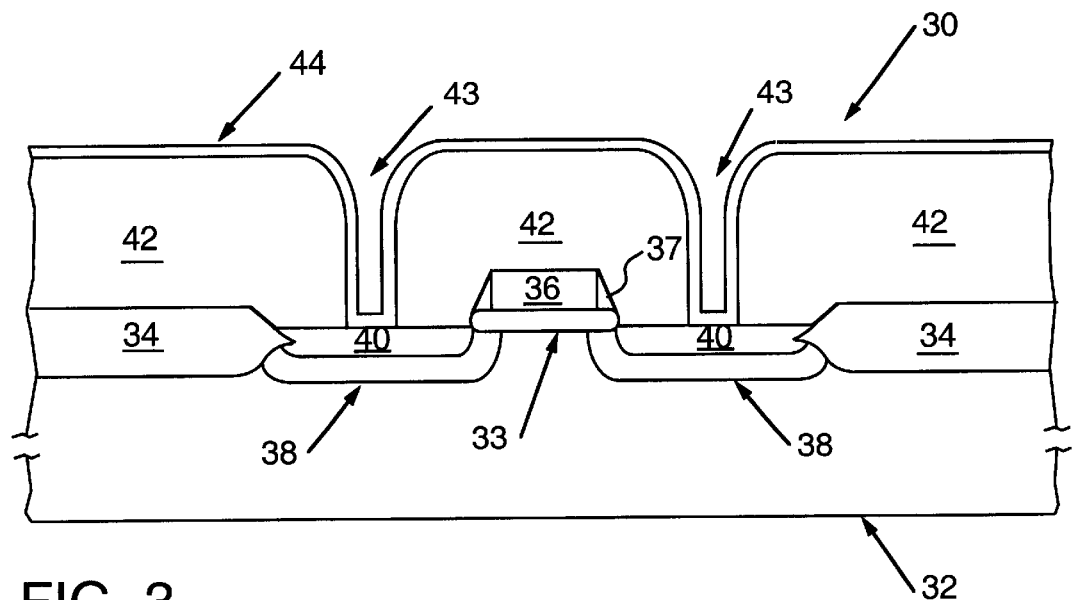
FIG. 3 is a cross-sectional view of the substrate assembly of FIG. 2 on which a promoter layer has been deposited on the etched photoresist layer.

FIG. 3 shows the substrate assembly 30 of FIG. 2 after a bilayer adhesion promoter layer 44 is deposited by, for example, sputtering onto the surface of the etched photoresist layer 42. Ionized sputtering is preferred to provide effective coverage of the sidewalls of deep openings. A chemical vapor deposition (CVD) process may also be used to deposit the bilayer adhesion promotor layer 44. The bilayer adhesion promoter layer 44 can be, among other substances, titanium/copper, chromium/copper, titanium nitride/copper, or tantalum/copper.

Figure 4:
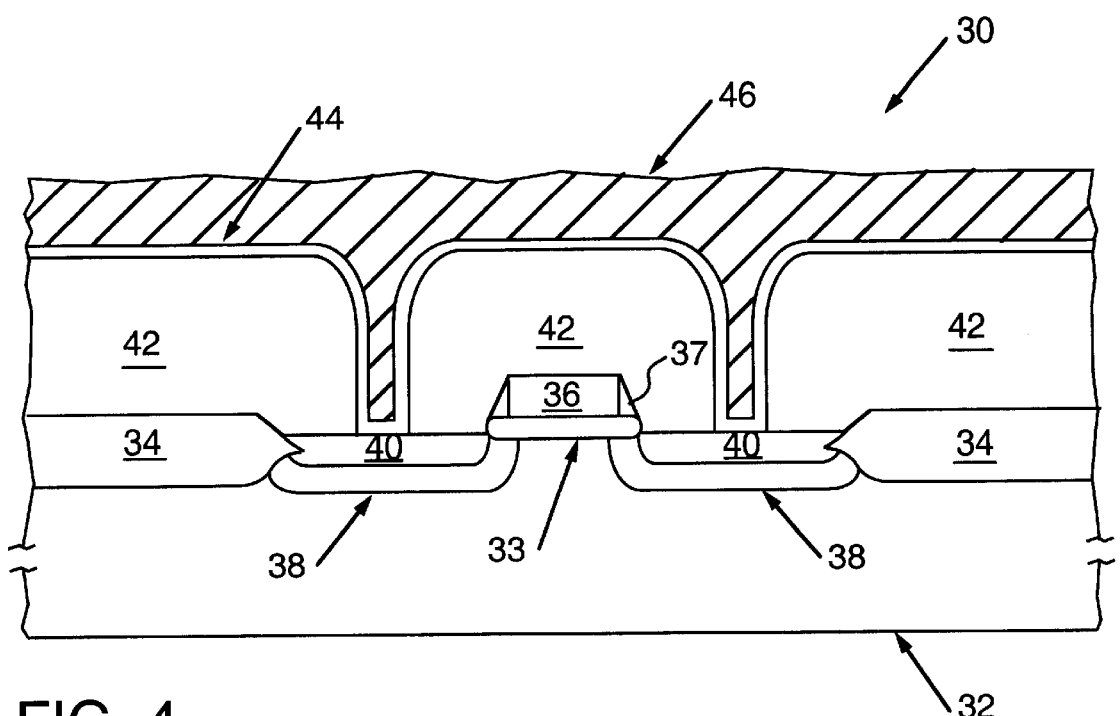
FIG. 4 is a cross-sectional view of the substrate assembly of FIG. 3 on which a metal layer has been deposited on the promoter layer.
Figure 5:
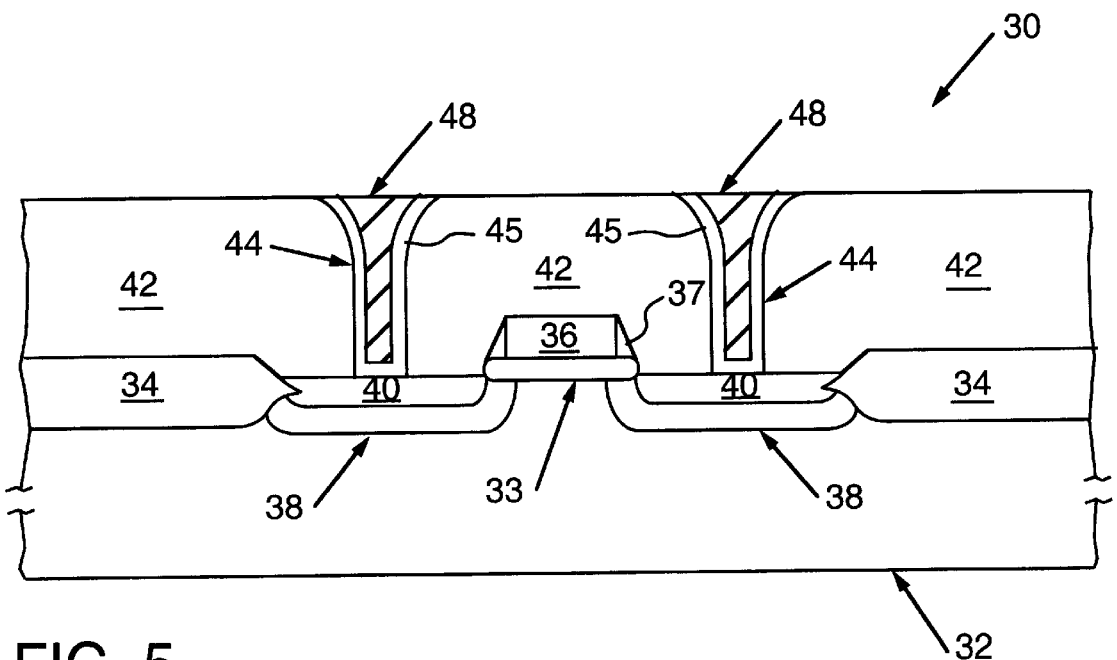
FIG. 5 is a cross-sectional view of the substrate assembly of FIG. 4 following removal of excess metal from the metal layer to form metal plugs.

As shown in FIG. 4, a metal layer 46 is formed by, for example, plating on the bilayer adhesion promoter layer 44. The metal layer 46 is preferably copper, which can be electroplated or electroless plated on the substrate assembly 30 at a process temperature around 30° C. The metal layer 46 may also be deposited using a CVD process. The excess metal from the metal layer 46 and the excess bilayer adhesion promoter layer 44 are removed through mechanical abrasion, for example, by chemical mechanical polishing, to form metal plugs 48, as shown in FIG. 5. The substrate assembly 30 is planar after the removal of the excess metal and the remaining portions of the bilayer adhesion promoter layer 44 define receptacles 45, in which the metal plugs 48 are located.

Figure 6:
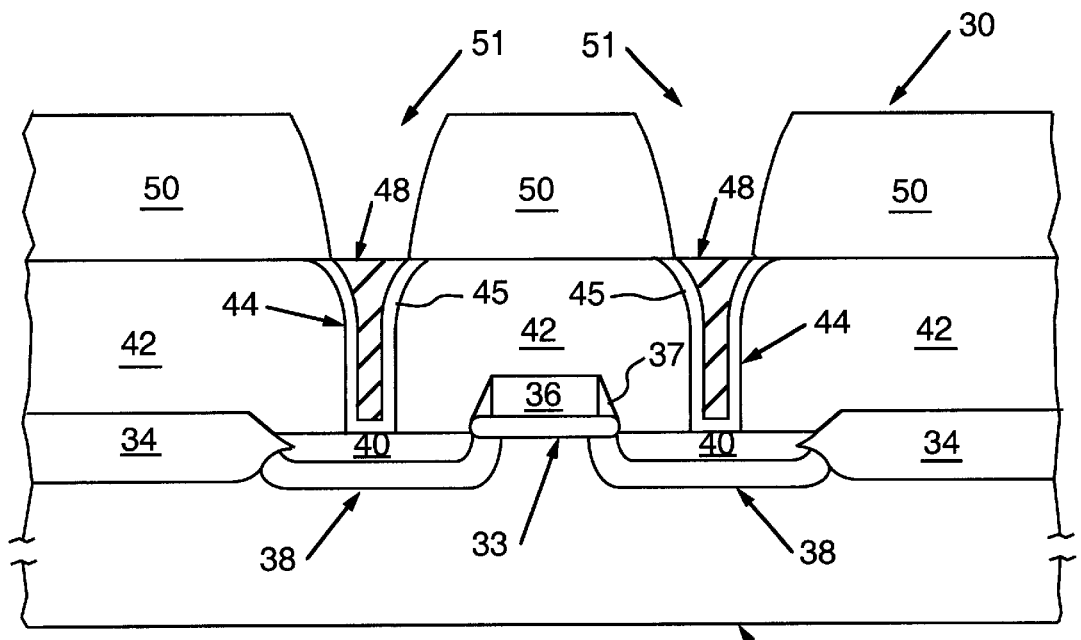
FIG. 6 is a cross-sectional view of the substrate assembly of FIG. 5 on which a photoresist layer has been deposited, masked, hardened, and etched on the promoter layer and metal plugs.
Figure 7:
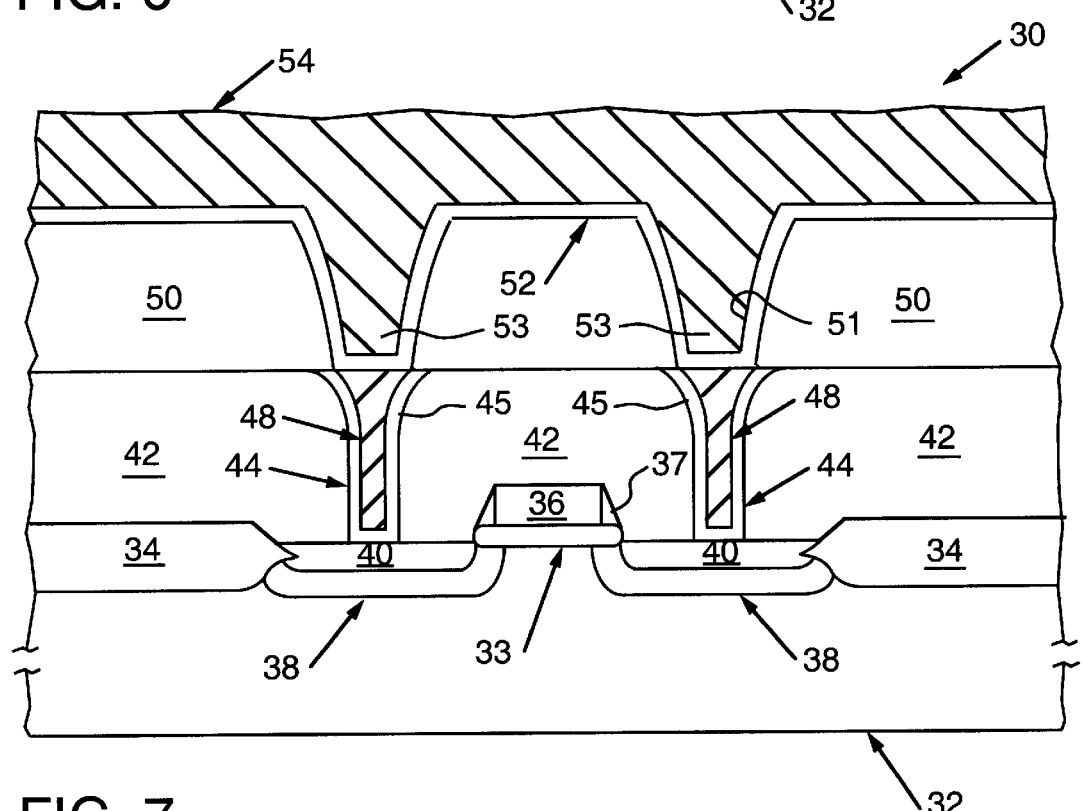
FIG. 7 is a cross-sectional view of the substrate assembly of FIG. 6 on which a promoter layer and a first metal layer have been deposited on the etched photoresist layer.
Figure 8:
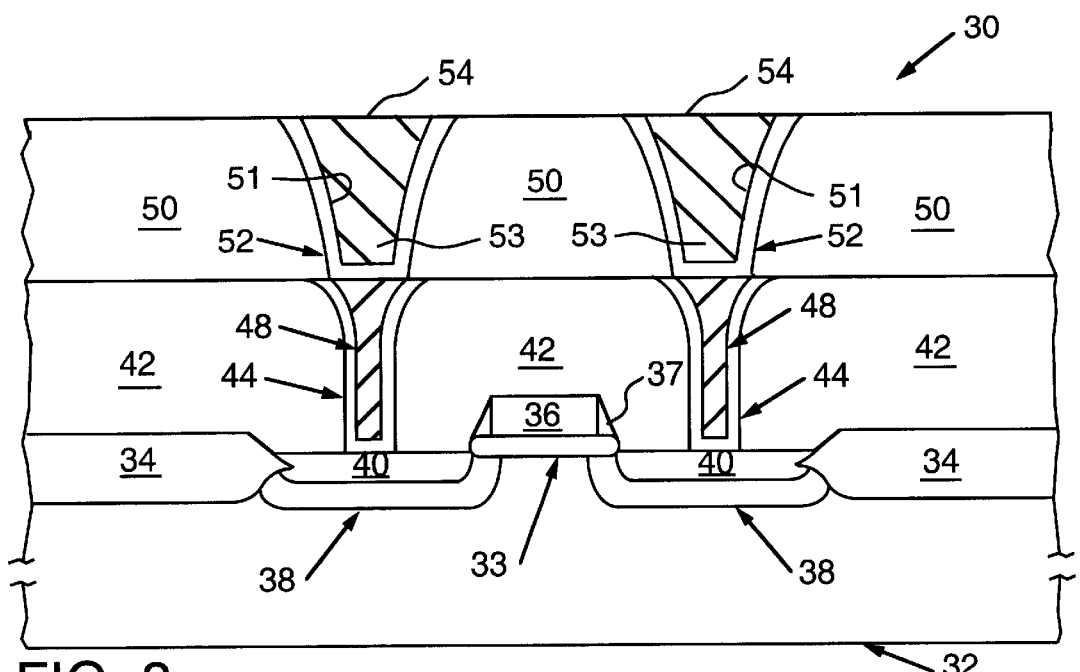
FIG. 8 is a cross-sectional view of the substrate assembly of FIG. 7 following the removal of excess metal from the first metal layer.

Another photoresist layer 50 is deposited onto the bilayer adhesion promoter layer 44 and the metal plugs 48 as shown in FIG. 6. The photoresist layer 50 is masked, hardened, and etched to define openings 51 for a metal layer which is aligned with the plugs 48. FIG. 7 shows a bilayer adhesion promoter layer 52 deposited on the etched photoresist layer 50 and the metal plugs 48 and a first metal layer 54 plated on the bilayer adhesion promoter layer 52. A portion of the metal fills the openings 51 forming contacts 53. Excess metal from the first metal layer 54 and excess bilayer adhesion promoter layer 52 are removed by mechanical abrasion, as shown in FIG. 8. Thus, the first metal layer 54 has contacts 53 and the resulting substrate assembly is planar.

Figure 9:
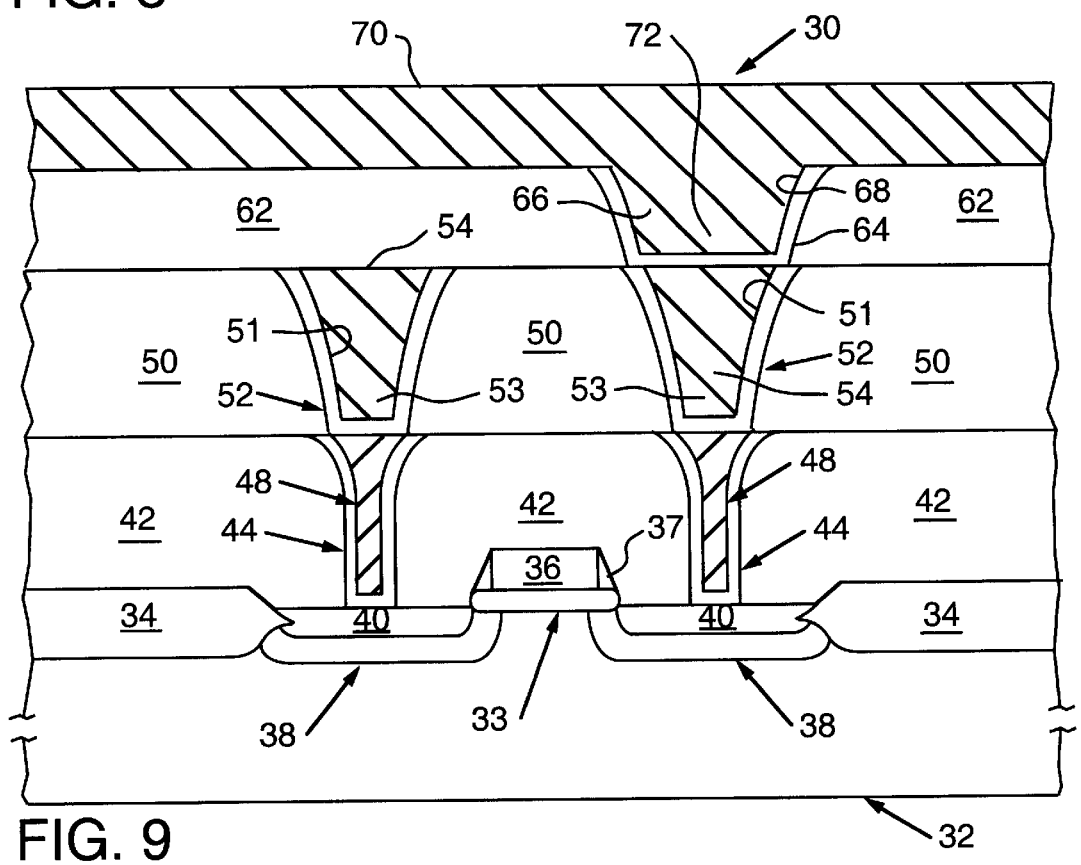
FIG. 9 is a cross sectional view of the substrate assembly of FIG. 8 following the addition of a photoresist layer, a bilayer adhesion promoter layer, a metal plug, and a second metal layer onto the etched photoresist layer and the first metal layer.

FIG. 9 illustrates the substrate assembly 30 of FIG. 8 after photoresist layer 62 is deposited, hardened and etched, bilayer adhesion promoter layer 64 is deposited, and a metal layer is deposited onto the substrate assembly 30. The substrate assembly 30 in FIG. 9 has been mechanically polished to remove the excess metal and the remaining portions of the bilayer adhesion promoter layer 64 to form metal plug 66 in receptacle 68. A second metal layer 70 has been deposited on the substrate assembly 30 to form contact 72. Multiple layers of metal can be built up by adding layers of bilayer adhesion promoter, photoresist, and metal.

Figure 10:
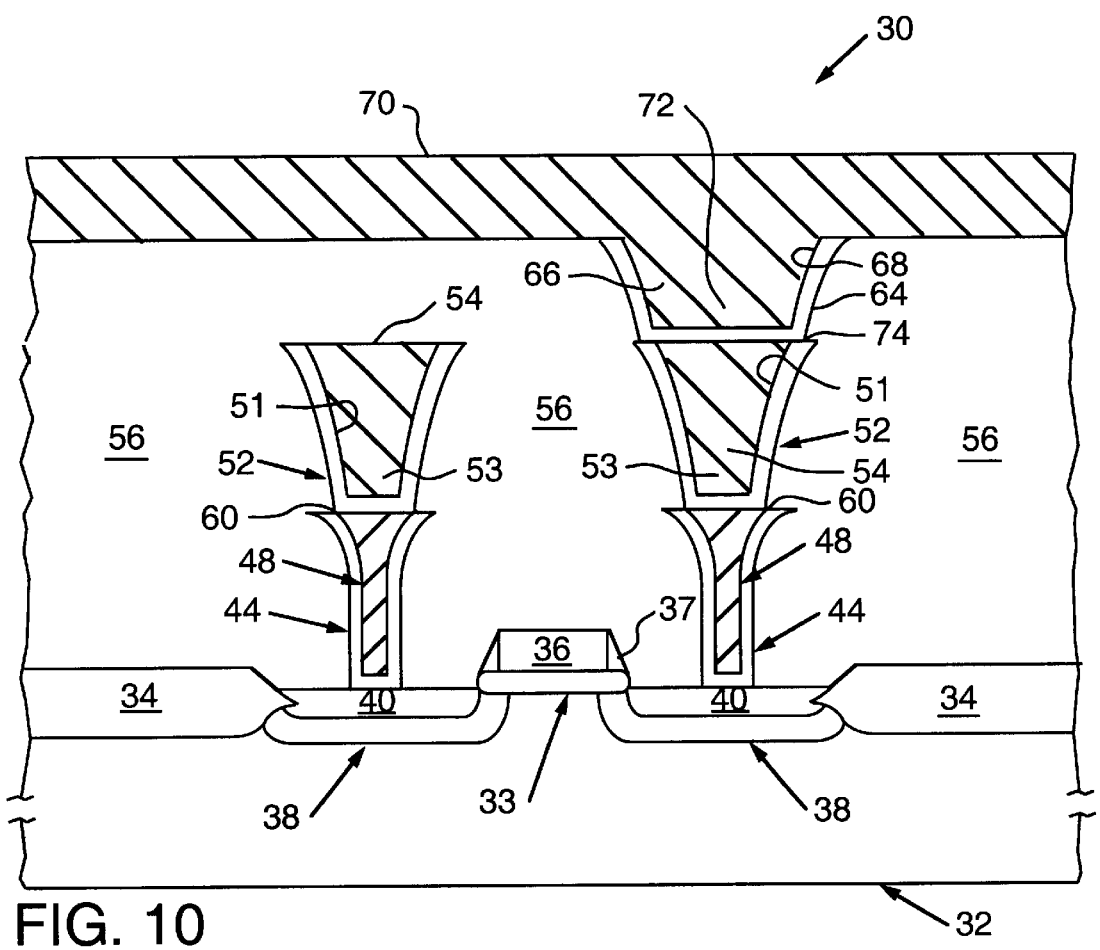
FIG. 10 is a cross-sectional view of the substrate assembly of FIG. 9 following the removal of the photoresist layers to form gaps between the promoter layers and the underlying substrate assembly.

FIG. 10 shows a resulting substrate assembly 30 of FIG. 9 with the first metal layer 54 and the second metal layer 70 formed. The photoresist layers 42, 50 and 62 are removed by, for example, ashing in oxygen plasma to form air gaps 56. The metal layers 54 and 70 are supported by columns 60 and 74 formed by the combination of the metal plugs 48 and 66 and the contacts 53 and 72. The air gaps 56 have a dielectric constant of 1, thereby reducing the capacitance of the resulting structure. By selecting appropriate metal conductors which have a low resistance, the RC time constant of the resulting structure is reduced.

The present invention also contemplates a method by which the above-described semiconductor interconnect structure is fabricated using typical fabrication steps, materials, and machines. The method, in its broadest form, is comprised of the steps of depositing a layer of photoresist on a substrate assembly. The photoresist is etched to form openings. A metal layer is formed on the photoresist layer so as to fill the openings formed in the photoresist layer. Thereafter, the photoresist layer is removed by, for example, ashing. The metal layer is thus supported by the metal which filled the openings formed in the photoresist.

The method of the present invention may be modified by, for example, depositing a promoter layer prior to forming the metal layer. Conventional techniques may be used for the "depositing" and "forming" steps such as sputtering and electroplating. A wide variety of metals and promoters may be used in the process.

Figure 11:
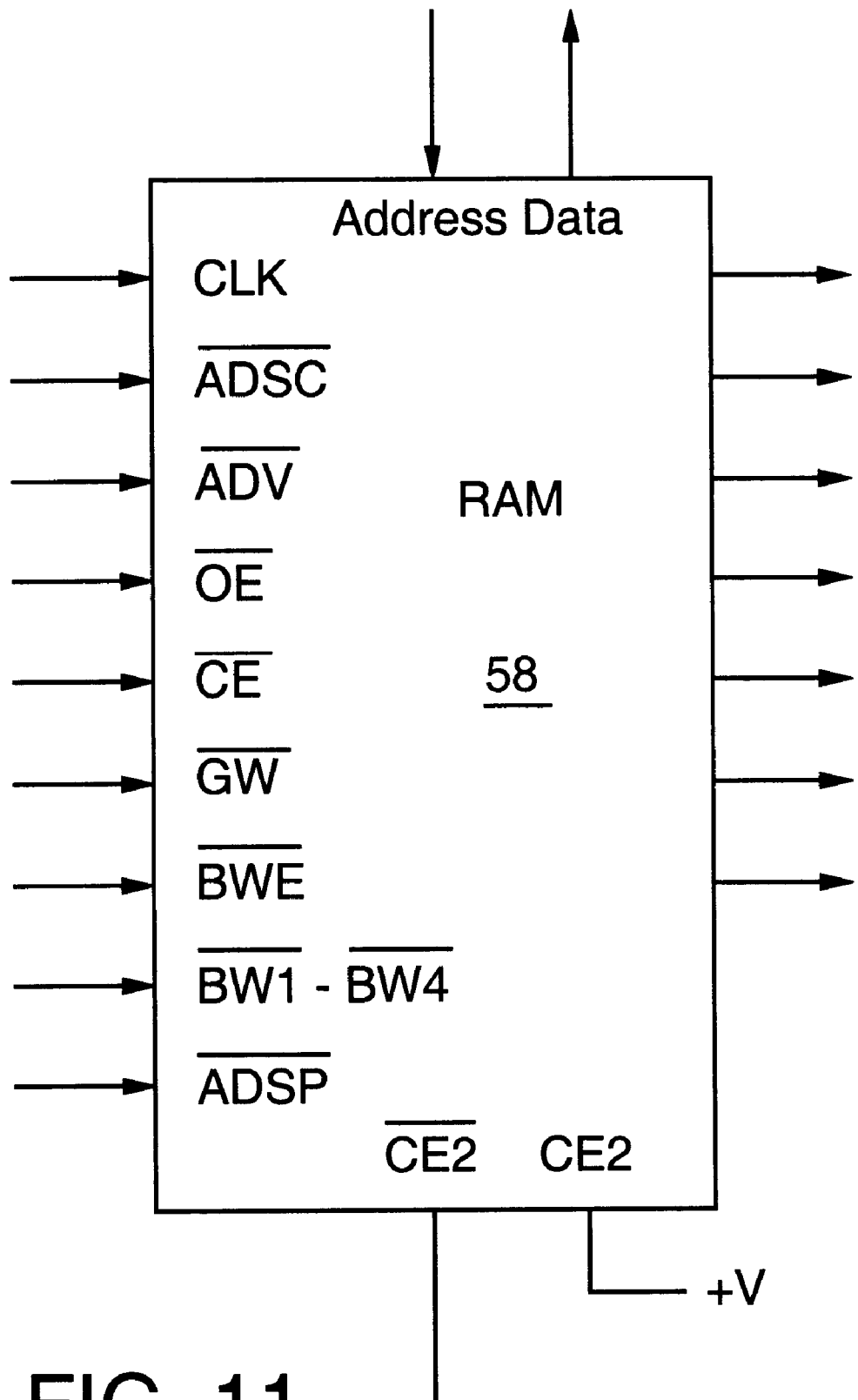
FIG. 11 illustrates a semiconductor device in which the present invention may be used.

FIG. 11 illustrates a semiconductor device 58 in which the present invention may be employed. The semiconductor device 58 may be any type of solid state device, such as a memory device.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A semiconductor interconnect structure for a substrate assembly, comprising:

a metal layer;

a conductive column connected to the substrate assembly and the metal layer, wherein the conductive column includes:

a first end connected to the substrate assembly;

a second end connected to the metal layer, wherein a cross-sectional area of the second end of the conductive column is greater than a cross-sectional area of the first end of the conductive column;

a bilayer adhesion promoter layer; and a metal plug in contact with the bilayer adhesion promoter layer, wherein the metal plug includes a planar top surface; and an air gap surrounding the conductive column, wherein the air gap includes:

a lower boundary defined by the substrate assembly; and an upper boundary defined by the metal layer.

2. The semiconductor interconnect structure of claim 1, wherein the metal layer includes copper.

3. The semiconductor interconnect structure of claim 1, wherein the bilayer adhesion promoter layer is in contact with the substrate assembly.

4. The semiconductor interconnect structure of claim 1, wherein the bilayer adhesion promoter layer includes copper and a material selected from the group consisting of titanium, chromium, titanium nitride, and tantalum.

5. The semiconductor interconnect structure of claim 1, wherein the bilayer adhesion promoter layer includes a portion that is coplanar with the top surface of the metal plug.

6. The semiconductor interconnect structure of claim 1, wherein the metal plug is a tapered metal plug.

7. The semiconductor interconnect structure of claim 1, wherein the metal plug includes copper.

8. A semiconductor interconnect structure for a substrate assembly, comprising:

a metal layer;

a conductive column connected to the substrate assembly and the metal layer, wherein the conductive column includes:

a first end connected to the substrate assembly;

a second end connected to the metal layer, wherein a cross-sectional area of the second end of the conductive column is greater than a cross-sectional area of the first end of the conductive column;

a first bilayer adhesion promoter layer;

a first metal plug in contact with the first bilayer adhesion promoter layer, wherein the first metal plug includes a planar top surface;

a second bilayer adhesion promoter layer in contact with the first metal plug; and a second metal plug in contact with the second bilayer adhesion promoter layer, wherein the second metal plug includes a planar top surface; and an air gap surrounding the conductive column, wherein the air gap includes:
a lower boundary defined by the substrate assembly; and
an upper boundary defined by the metal layer.

9. The semiconductor interconnect structure of claim 8, wherein at least one of the first and second bilayer adhesion promoter layers includes copper and a material selected from the group consisting of titanium, chromium, titanium nitride, and tantalum.

10. The semiconductor interconnect structure of claim 8, wherein the first and second bilayer adhesion promoter layers include copper and a material selected from the group consisting of titanium, chromium, titanium nitride, and tantalum.

11. The semiconductor interconnect structure of claim 8, wherein at least one of the first and second metal plugs includes copper.

12. The semiconductor interconnect structure of claim 8, wherein the first and second metal plugs include copper.

13. A semiconductor interconnect between an upper conductor and a lower conductor, comprising:
a conductive column connected to the upper conductor and the lower conductor, wherein the conductive column includes:
a first end connected to the substrate assembly;
a second end connected to the metal layer, wherein a cross-sectional area of the second end of the conductive column is greater than a cross-sectional area of the first end of the conductive column;
a bilayer adhesion promoter layer; and
a metal plug in contact with the bilayer adhesion promoter layer, wherein the metal plug includes a planar top surface; and
an air gap surrounding the conductive column, wherein the air gap includes:
a lower boundary defined by the lower conductor; and
an upper boundary defined by the upper conductor.

14. A semiconductor interconnect between an upper conductor and a lower conductor, comprising:
a conductive column connected to the upper conductor and the lower conductor, wherein the conductive column includes:
a first end connected to the substrate assembly;
a second end connected to the metal layer, wherein a cross-sectional area of the second end of the conductive column is greater than a cross-sectional area of the first end of the conductive column;
a first bilayer adhesion promoter layer;
a first metal plug in contact with the first bilayer adhesion promoter layer, wherein the first metal plug includes a planar top surface;
a second bilayer adhesion promoter layer in contact with the first metal plug; and
a second metal plug in contact with the second bilayer adhesion promoter layer, wherein the second metal plug includes a planar top surface; and an air gap surrounding the conductive column, wherein the air gap includes:
a lower boundary defined by the lower conductor; and
an upper boundary defined by the upper conductor.

15. A semiconductor device, comprising:
a substrate assembly; and
an interconnect structure, wherein the interconnect structure includes:
a metal layer;
a conductive column connected to the substrate assembly and the metal layer, wherein the conductive column includes:
a first end connected to the substrate assembly;
a second end connected to the metal layer, wherein a cross-sectional area of the second end of the conductive column is greater than a cross-sectional area of the first end of the conductive column;
a bilayer adhesion promoter layer; and
a metal plug in contact with the bilayer adhesion promoter layer, wherein the metal plug includes a planar top surface; and
an air gap surrounding the conductive column, wherein the air gap includes:
a lower boundary defined by the substrate assembly; and
an upper boundary defined by the metal layer.

16. A semiconductor device, comprising:
a substrate assembly; and
an interconnect structure, wherein the interconnect structure includes:
a metal layer;
a conductive column connected to the substrate assembly and the metal layer, wherein the conductive column includes:
a first end connected to the substrate assembly;
a second end connected to the metal layer, wherein a cross-sectional area of the second end of the conductive column is greater than a cross-sectional area of the first end of the conductive column;
a first bilayer adhesion promoter layer;
a first metal plug in contact with the first bilayer adhesion promoter layer, wherein the first metal plug includes a planar top surface;
a second bilayer adhesion promoter layer in contact with the first metal plug; and
a second metal plug in contact with the second bilayer adhesion promoter layer, wherein the second metal plug includes a planar top surface; and
an air gap surrounding the conductive column, wherein the air gap includes:
a lower boundary defined by the substrate assembly; and
an upper boundary defined by the metal layer.

* * * * *